United States Patent
Brink et al.

(10) Patent No.: US 9,728,421 B2
(45) Date of Patent: Aug. 8, 2017

(54) HIGH ASPECT RATIO PATTERNING OF HARD MASK MATERIALS BY ORGANIC SOFT MASKS

(71) Applicant: International Business Machines Corporation, Armonk, NY (US)

(72) Inventors: Markus Brink, White Plains, NY (US); Sebastian U. Engelmann, White Plains, NY (US); Eric A. Joseph, White Plains, NY (US); Hiroyuki Miyazoe, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/985,951

(22) Filed: Dec. 31, 2015

(65) Prior Publication Data
US 2017/0194161 A1    Jul. 6, 2017

(51) Int. Cl.
*H01L 21/311* (2006.01)
*H01L 21/02* (2006.01)

(52) U.S. Cl.
CPC .. *H01L 21/31116* (2013.01); *H01L 21/02321* (2013.01)

(58) Field of Classification Search
CPC ............. H01L 21/31116; H01L 21/02321
See application file for complete search history.

(56) References Cited

U.S. PATENT DOCUMENTS

| | | | |
|---|---|---|---|
| 6,916,746 B1 | 7/2005 | Hudson et al. | |
| 7,517,801 B1 | 4/2009 | Takeshita | |
| 7,977,390 B2 * | 7/2011 | Ji | H01L 21/0337 216/37 |
| 8,329,585 B2 | 12/2012 | Sheu et al. | |
| 8,425,789 B2 | 4/2013 | Kobrin | |
| 8,513,114 B2 | 8/2013 | Tagami | |
| 8,835,092 B2 | 9/2014 | Watanabe et al. | |
| 8,883,649 B2 | 11/2014 | Yin et al. | |
| 9,054,050 B2 | 6/2015 | LeFevre et al. | |
| 2005/0136682 A1 * | 6/2005 | Hudson | H01L 21/31116 438/714 |
| 2015/0294880 A1 * | 10/2015 | Anderson | H01L 21/31116 438/719 |

OTHER PUBLICATIONS

Wakamatsu, G. et al., "Investigation of pattern wiggling for spin-on organic hardmask materials," SPIE vol. 8325, 2012, 83250T, pp. 1-9.

Sakai, K. et al., "Novel thin film analysis to investigate actual film formation," SPIE vol. 9425, 2015, 942522, pp. 1-9.

(Continued)

*Primary Examiner* — Duy Deo
(74) *Attorney, Agent, or Firm* — Scully, Scott, Murphy & Presser, P.C.; Louis J. Percello, Esq.

(57) ABSTRACT

A method of etching a pattern into a dielectric layer is provided. An organic planarization layer having a pattern is provided atop a dielectric layer. A cyclic fluorocarbon deposition step and plasma step is performed to etch the pattern into the dielectric layer. The energy for the plasma step is kept below the etch threshold of the dielectric layer.

16 Claims, 1 Drawing Sheet

(56) References Cited

OTHER PUBLICATIONS

Yeom, J. et al., "Maximum achievable aspect ratio in deep reactive ion etching of silicon due to aspect ratio dependet transport and the microloading effect," J. Vac. Sci. Technol. B, vol. 23, No. 6, Nov./Dec. 2005, pp. 2319-2329.
Schaepkens, M. et al., "Influence of reactor wall conditions on etch processes in inductively coupled fluorocarbon plasmas", J. Vac. Sci. Technol. A, vol. 16, No. 4, Jul./Aug. 1998, pp. 2099-2104.
http://electroiq.com/blog/2014/01/moving-atomic-layer-etch-from-lab-to-fab/, "Moving atomic layer etch from lab to fab" printed Nov. 24, 2015.
Anderson, S.A. et al., "Exploring the 65nm frontier of alternating phase shifting masks with a quartz dry etch chemistry", Proc. SPIE 5754, Optical Microlithography XVIII, vol. 5754, May 12, 2004, pp. pp. 1-10.
Magnusson, P., "Plasma Etching; Ion sputtering in a RIE", http://www.kth.se/polopolyfs/1.254043!/Menu/general/column-content/attachment/report22.pdf, created on Oct. 5, 2011, pp. 1-6.
Agarwal, A. et al., "Plasma atomic layer etching using conventional plasma equipment", Journal of Vacuum Science & Technology A, vol. 27, Issue 1, Jan./Feb. 2009, pp. 37-50.

\* cited by examiner

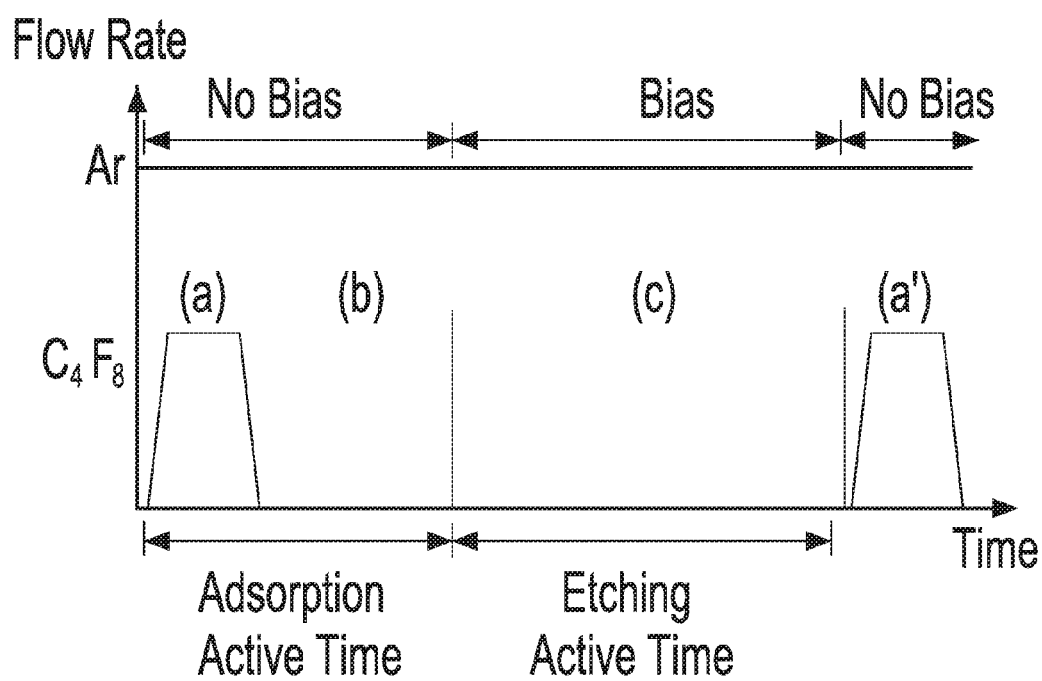

HIGH ASPECT RATIO PATTERNING OF HARD MASK MATERIALS BY ORGANIC SOFT MASKS

BACKGROUND

The present application relates to semiconductor processing; more particularly to a method of etching hard mask materials with fidelity to high aspect ratio patterns having small pitch features on the order of 40 nm or less.

For several decades now, the semiconductor industry has sought continued miniaturization. As critical dimensions and related pitches have shrunk, greater exactitude in etching has been required. In small scale etching, a pattern defect known as wiggling can arise. This type of pattern deformation is due to the uncontrolled release of hydrogen and/or oxygen from the organic soft masks used to transfer the pattern onto materials such as dielectrics. The result is line edge roughness (LER) and/or line width roughness (LWR) defects in the final patterned product.

There is thus a need to provide a process that will transfer small pitch pattern features from an organic soft mask to a hard mask material without pattern wiggling and resultant LER and/or LWR.

SUMMARY

The present application provides a method of etching a pattern into a dielectric layer. The method includes providing an organic planarization layer that has a pattern. The organic planarization layer is provided atop a dielectric layer to which the pattern is to be transferred. The method includes performing a fluorocarbon deposition step followed by a plasma step, which steps can be repeatedly performed in a cycle until the pattern is etched into the dielectric layer. The energy required for the plasma step is maintained below the etch threshold of the dielectric layer.

In one embodiment, the method includes providing a pattern, underneath which pattern is a substrate. The substrate can include an organic planarization layer (OPL) atop a dielectric layer, e.g. silicon dioxide ($SiO_2$), which can be atop a semiconductor substrate. An inert gas, e.g. argon, is contacted with the pattern. This contact can be intermittent or continuous. The pattern is then contacted with a fluorine-containing gas, e.g. $C_4F_8$, under conditions effective to form a fluorocarbon film on that portion of the substrate that is to be etched in accordance with the pattern. In one embodiment, the fluorocarbon film is adsorbed at least in part into the substrate. The fluorine-containing gas is then purged, e.g. by evacuation, after which the inert gas is biased to form an inert gas plasma, e.g. argon ions (Ar+), under conditions effective to etch that portion of the substrate, either the OPL or the dielectric layer depending on the point of the etch cycle, having the fluorocarbon film; the biasing is below the threshold of the dielectric layer. The steps of the method can be repeated until the pattern, which can have a pitch feature of less than 40 nm, is sufficiently etched into the dielectric layer.

BRIEF DESCRIPTION OF THE DRAWING

The FIGURE is a graphical depiction of an exemplary deposition and plasma sequence for an embodiment of the etching method.

DETAILED DESCRIPTION

The present application will now be described in greater detail by referring to the following discussion and drawing that accompanies the present application. It is noted that the drawing of the present application is provided for illustrative purposes only. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

In one embodiment, an organic planarization layer (OPL) having a pattern is provided atop a dielectric layer. The OPL can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL can include a transparent organic polymer. The OPL can be a standard $C_xH_y$ polymer. Non-limiting examples of OPL materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd. The OPL can be applied, for example, by spin-coating. In one embodiment, the thickness of the OPL can be from about 30 nm to about 200 nm, although lesser and greater thicknesses can also be employed.

In one embodiment, the pattern on the OPL can be defined by lithography. Lithography includes forming a photoresist material atop a material to be patterned; in the present application, the photoresist material is formed atop the OPL. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the OPL. The pattern provided by the patterned photoresist material can then be thereafter transferred into the OPL by utilizing at least one pattern transfer etching process, such as a dry etching process such as, for example, reactive ion etching can be used. In another embodiment, a chemical etchant can be used. In still a further embodiment, a combination of dry etching and wet etching can be used transfer the pattern into the OPL. In one embodiment, the patterns are for pitch features up to 40 nm. In another embodiment, the pitch features are between about 20 nm to about 40 nm. In one embodiment, the pitch features are about 40 nm and have a height of about 80 nm and a width of about 15 nm.

In one embodiment, the dielectric layer includes a transparent dielectric material such as silicon dioxide, silicon nitride, or silicon oxynitride. In one embodiment, the dielectric layer can be formed by chemical vapor deposition (CVD) processes. The thickness of the dielectric layer can be from about 10 nm to about 50 nm, although lesser and greater thicknesses can also be employed.

In one embodiment, the dielectric layer is atop a semiconductor substrate. In some embodiments of the present application, the semiconductor substrate can be a bulk semiconductor substrate. The term "bulk semiconductor substrate" denotes a substrate that is entirely composed of at least one semiconductor material. When a bulk semiconductor substrate is employed as semiconductor substrate, the bulk semiconductor substrate can be comprised of any semiconductor material including, but not limited to, Si, Ge, SiGe, SiC, SiGeC, and III/V compound semiconductors such as, for example, InAs, GaAs, and InP. Multilayers of these semiconductor materials can also be used as the semiconductor material of the bulk semiconductor substrate. In one embodiment, the bulk semiconductor substrate that can provide the semiconductor substrate can be comprised of a single crystalline semiconductor material, such as, for example, single crystalline silicon. In other embodiments, the bulk semiconductor substrate that can provide the semiconductor substrate may comprise a polycrystalline or amorphous semiconductor material.

In another embodiment, the semiconductor substrate may comprise a semiconductor-on-insulator (SOI) substrate. One skilled in the art understands that an SOI substrate includes a handle substrate, an insulator layer located on an upper surface of the handle substrate, and a topmost semiconductor layer located on an upper surface of the insulator layer. The handle substrate provides mechanical support for the insulator layer and the topmost semiconductor layer.

The handle substrate and the topmost semiconductor layer of the SOI substrate may comprise the same, or different, semiconductor material. The semiconductor material of the handle substrate and the topmost semiconductor layer can include one of the semiconductor materials mentioned above for the bulk semiconductor substrate. Multilayers of semiconductor materials can also be used as the semiconductor material of the handle substrate and the topmost semiconductor layer. In one embodiment, the handle substrate and the topmost semiconductor layer are both comprised of silicon. In some embodiments, the handle substrate is a non-semiconductor material including, for example, a dielectric material and/or a conductive material. In yet other embodiments, the handle substrate can be omitted and a substrate including the insulator layer and the topmost semiconductor layer can be used in the present application.

In some embodiments, the handle substrate and the topmost semiconductor layer of the SOI substrate may have the same or different crystal orientation. For example, the crystal orientation of the handle substrate and/or the semiconductor layer may be {100}, {110}, or {111}. Other crystallographic orientations besides those specifically mentioned can also be used in the present application. The handle substrate and/or the top semiconductor layer of the SOI substrate may be a single crystalline semiconductor material, a polycrystalline material, or an amorphous material. Typically, at least the topmost semiconductor layer is a single crystalline semiconductor material. In some embodiments, the topmost semiconductor layer that is located atop the insulator layer can be processed to include semiconductor regions having different crystal orientations.

The insulator layer of the SOI substrate may be a crystalline or non-crystalline oxide or nitride. In one embodiment, the insulator layer is an oxide such as, for example, silicon dioxide. The insulator layer may be continuous or it may be discontinuous. When a discontinuous insulator region is present, the insulator region can exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the topmost semiconductor layer to a layer having a thickness that is more desirable.

In one embodiment, a cyclic fluorocarbon deposition step and plasma step is performed to etch the pattern into the dielectric layer. By "cyclic" is meant that the sequence of deposition and plasma steps can be repeated until the dielectric is sufficiently etched. In one embodiment, the fluorocarbon deposition step comprises contacting the pattern with a fluorine-containing gas under conditions effective to form a fluorocarbon film on (i) the portions of the OPL to be etched according to the pattern, and/or (ii) the portions of the dielectric layer to be etched according to the pattern after the organic planarization layer has been etched. The formation of the fluorocarbon film includes, without limitation, the adsorption of at least a portion of the pertaining fluorocarbon into the OPL and/or the dielectric layer. In one embodiment, the fluorine-containing gas can include $C_4F_8$, $CF_4$ and combinations thereof. Insofar as the etch occurs in a closed chamber, the fluorine-containing gas may be pulsed into the chamber to provide the fluorocarbon film; in one embodiment, the fluorine-containing gas may be pulsed into the chamber at a rate of 10% of the total plasma on time or less; the contact time for the fluorine-containing gas and the pattern, including the OPL and/or the dielectric layer depending upon the point of the etch process, is up to about 5 seconds, including, without limitation, times of about 0.5 seconds to about 5 seconds. The pulsing may be intermittent with the plasma step as part of the cycle. In one embodiment, the temperature of the OPL and dielectric layer is between about 0° C. to about 250° C.

In one embodiment, the plasma step of the cycle includes contacting the fluorocarbon film with an inert gas plasma under conditions to etch the fluorocarbon film, including adsorbed fluorocarbon, formed on (i) the portions of the OPL to be etched according to the pattern, and/or (ii) the portions of the dielectric layer to be etched according to the pattern after the organic planarization layer has been etched. In one embodiment, the inert gas plasma includes, without limitation, argon gas plasma (Ar+ ions), and fluorocarbon gas plasmas. In one embodiment, the inert gas can be continuously supplied to the etch chamber. When continuously supplied, the plasma step may be conducted by biasing the inert gas, e.g. argon, to form the plasma. In another embodiment, the inert gas can be pulsed into the chamber intermittent with the fluorocarbon deposition step. In any embodiment, the energy of the plasma step, e.g. as measured by the biasing energy, is below the etch threshold of the dielectric layer. The "etch threshold" herein is the energy level above which physical sputtering of the dielectric layer occurs. In one embodiment, the energy of the plasma step is no greater than 20 eV; in another embodiment, the energy of the plasma step is between about 20 eV and about 100 eV. In one embodiment, the plasma step is performed for up to about 60 seconds; in another embodiment, the plasma step is performed for between about 1 seconds and about 60 seconds.

The fluorocarbon deposition step and the plasma step are discrete steps, separated by sufficient time to allow conclusion of each step to occur. In one embodiment, the fluorocarbon deposition step is followed by a purge step to remove any remaining fluorine-containing gas from the chamber before occurrence of the plasma step. In one embodiment, the purge step includes an evacuation of the chamber, by e.g. vacuum or purge gas or both, after which the plasma step is conducted. In one embodiment, the purge step is an evacuation performed for up to 60 seconds.

Referring to the FIGURE, depicted thereat is an exemplary embodiment of a cyclic fluorocarbon deposition step and inert gas plasma step for etching. The embodiment shows a continuous flow of argon gas. The fluorine-containing gas is $C_4F_8$. As shown in the FIGURE, the cycle includes a fluorocarbon deposition step which in the embodiment shown includes steps (a) and (b). In step (a), $C_4F_8$ is pulsed into the chamber to contact the pattern and the OPL and/or dielectric, for a time of about 1 second. At the conclusion of the $C_4F_8$ pulse (a), the chamber is evacuated, denoted as step (b), for about 15 seconds to remove any remaining $C_4F_8$. While evacuation (b) takes places, fluorocarbon film formation and adsorption can still occur thus making it part of deposition step. During the deposition step, the argon gas is not biased; that is, no removal of the OPL or dielectric occurs. After evacuation (b), the inert plasma gas step is formed, step (c), by biasing the argon in order to etch, according to the pattern, those portions of the OPL and/or dielectric layer on which the fluorocarbon adsorption (film formation) has occurred. Step (c) is performed for about 60 seconds. The argon gas is biased to no greater than 100 eV which is below the threshold etch voltage for the dielectric layer, e.g. $SiO_2$. At the conclusion of step (c), the bias energy is stopped, and the next fluorocarbon deposition step in the cycle, step (a') begins, which can be under the same or different from the conditions as step (a), e.g. $C_4H_8$ flow rate, pulse time.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of etching a pattern into a dielectric layer comprising:

providing an organic planarization layer atop a dielectric layer;

forming a photoresist material layer atop said organic planarization layer;

patterning a portion of said photoresist to form a predetermined pattern in said portion of said photoresist material layer;

transferring said predetermined pattern from said photoresist material layer into said organic planarization layer;

performing a cyclic fluorocarbon deposition step and plasma step to etch the pattern in said organic planarization layer into the dielectric layer; and maintaining the energy for the plasma step no greater than 20 eV which is below the etch threshold voltage of the dielectric layer.

2. The method of claim 1 wherein the dielectric layer is atop a semiconductor substrate.

3. The method of claim 1 further comprising performing a purge step after the fluorocarbon deposition step and before the plasma step.

4. The method of claim 1 wherein the organic planarization layer comprises an organic polymer containing carbon, hydrogen, oxygen, and optionally containing nitrogen, fluorine, and silicon.

5. The method of claim 1 wherein the fluorocarbon deposition step comprises contacting the pattern with a fluorine-containing gas under conditions effective to form a fluorocarbon film on (i) the portions of the organic planarization layer to be etched according to the pattern, and (ii) the portions of the dielectric layer to be etched according to the pattern after the organic planarization layer has been etched.

6. The method of claim 5 wherein the fluorine-containing gas comprises $C_4F_8$, $CF_4$, or combinations thereof.

7. The method of claim 5 wherein the plasma step comprises contacting the fluorocarbon film with an inert gas plasma under conditions to etch the fluorocarbon film formed on (i) and (ii).

8. The method of claim 7 wherein the inert gas plasma comprises an argon gas plasma.

9. The method of claim 1 wherein the fluorocarbon deposition step is performed for up to 5 seconds.

10. The method of claim 1 wherein the plasma step is performed for up to 120 seconds.

11. The method of claim 1 wherein the dielectric layer comprises silicon dioxide.

12. The method of claim 2 wherein the semiconductor substrate comprises silicon.

13. The method of claim 3 wherein the purge step comprises an evacuation step.

14. The method of claim 13 wherein the purge step is performed for up to 60 seconds.

15. The method of claim 1 wherein the pattern comprises pitch features of less than 40 nm.

16. The method of claim 1, wherein the plasma step is performed for about 60 seconds.

* * * * *